(12) United States Patent
Nakamoto

(10) Patent No.: US 11,777,377 B2
(45) Date of Patent: Oct. 3, 2023

(54) ELECTRIC WORKING MACHINE WITH SEMICONDUCTOR ELEMENT THAT COMPLETES OR INTERRUPTS CURRENT PATH TO MOTOR

(71) Applicant: MAKITA CORPORATION, Anjo (JP)

(72) Inventor: Akihiro Nakamoto, Anjo (JP)

(73) Assignee: MAKITA CORPORATION, Anjo (JP)

( * ) Notice: Subject to any disclaimer, the term of this patent is extended or adjusted under 35 U.S.C. 154(b) by 566 days.

(21) Appl. No.: 16/693,623

(22) Filed: Nov. 25, 2019

(65) Prior Publication Data

US 2020/0169148 A1 May 28, 2020

(30) Foreign Application Priority Data

Nov. 28, 2018 (JP) ................................. 2018-222436

(51) Int. Cl.
*H02K 11/33* (2016.01)
*H01L 25/07* (2006.01)
(Continued)

(52) U.S. Cl.
CPC ......... *H02K 11/33* (2016.01); *A01D 34/6806* (2013.01); *A01D 34/78* (2013.01);
(Continued)

(58) Field of Classification Search
CPC .... H02K 11/33; H02K 11/25; H02K 11/0094; H02K 9/22; A01D 34/6806; A01D 34/78; A01D 2110/00; H01L 23/367; H01L 23/40–4006; H01L 23/34; H01L 23/36; H01L 23/373; H01L 23/3672; H01L 23/3677; H01L 23/433; H01L 23/467; H01L 23/4093; H01L 23/4081; H01L 25/072; H01L 2023/4031;
(Continued)

(56) References Cited

U.S. PATENT DOCUMENTS 4,707,726 A * 11/1987 Tinder ................ H01L 23/4093
257/796
6,191,369 B1 * 2/2001 Kusakawa ........... H05K 1/0269
174/260
(Continued)

FOREIGN PATENT DOCUMENTS

JP 2018-12154 A 1/2018
WO 2016/098564 A1 6/2016

OTHER PUBLICATIONS

Jun. 7, 2022 Office Action issued in Japanese Patent Application No. 2018-222436.

*Primary Examiner* — Amir A Jalali
(74) *Attorney, Agent, or Firm* — Oliff PLC

(57) ABSTRACT

An electric working machine includes: a motor; a semiconductor element that is provided in a current path to the motor and completes or interrupts the current path; a circuit board on which the semiconductor element is mounted, a control circuit that turns on and off the semiconductor element to control energization to the motor being assembled to the circuit board; and a heat sink for dissipating heat from the semiconductor element. The semiconductor element is attached to the heat sink via a metal-based board.

10 Claims, 6 Drawing Sheets

(51) Int. Cl.
*H05K 1/18* (2006.01)
*H02K 11/00* (2016.01)
*H02K 11/25* (2016.01)
*A01D 34/78* (2006.01)
*A01D 34/68* (2006.01)
*H01L 23/40* (2006.01)
*H02K 9/22* (2006.01)
*A01D 101/00* (2006.01)
*H01R 12/58* (2011.01)

(52) U.S. Cl.
CPC ........ *H01L 23/4006* (2013.01); *H01L 25/072* (2013.01); *H02K 9/223* (2021.01); *H02K 11/0094* (2013.01); *H02K 11/25* (2016.01); *H05K 1/18* (2013.01); *A01D 2101/00* (2013.01); *H01L 2023/4031* (2013.01); *H01L 2023/4062* (2013.01); *H01L 2023/4087* (2013.01); *H01R 12/58* (2013.01); *H02K 2211/03* (2013.01); *H05K 2201/066* (2013.01); *H05K 2201/10151* (2013.01); *H05K 2201/10166* (2013.01)

(58) Field of Classification Search
CPC ..... H01L 2023/4037; H01L 2023/4043; H01L 2023/405; H01L 2023/4075–4087; H05K 1/181; H05K 1/021; H05K 1/0203–0204; H05K 7/20; H05K 7/2039; H05K 7/2049; H05K 7/20154; H05K 7/20509; H05K 7/20854; H01H 9/52
See application file for complete search history.

(56) References Cited

U.S. PATENT DOCUMENTS

| | | | | |
|---|---|---|---|---|
| 6,404,065 | B1* | 6/2002 | Choi | H01L 24/06 257/782 |
| 7,286,361 | B2* | 10/2007 | Yamanaka | H05K 1/0203 257/722 |
| 7,580,264 | B2* | 8/2009 | Tanimoto | H01L 23/3672 165/185 |
| 2002/0141161 | A1* | 10/2002 | Matsukura | H01L 23/42 257/E23.087 |
| 2004/0164405 | A1* | 8/2004 | Umezu | H01L 23/367 257/E23.102 |
| 2005/0259401 | A1* | 11/2005 | Han | H05K 7/20963 361/704 |
| 2007/0247811 | A1* | 10/2007 | Ohmi | H05K 7/20909 361/697 |
| 2008/0080140 | A1* | 4/2008 | Hsieh | H01L 23/4006 257/E23.084 |
| 2009/0283765 | A1* | 11/2009 | Onishi | H01L 23/34 257/E23.08 |
| 2010/0271785 | A1* | 10/2010 | Hsieh | H01L 23/36 361/720 |
| 2012/0186887 | A1* | 7/2012 | Moriguchi | B60L 58/15 180/65.1 |
| 2013/0228890 | A1* | 9/2013 | Eisele | H01L 23/15 257/467 |
| 2013/0288091 | A1* | 10/2013 | Tsubaki | G01K 1/14 374/185 |
| 2018/0035530 | A1* | 2/2018 | Moribayashi | H05K 5/0008 |
| 2018/0342932 | A1* | 11/2018 | Wachter | H02K 9/22 |
| 2020/0198114 | A1 | 6/2020 | Suzuki | |

* cited by examiner

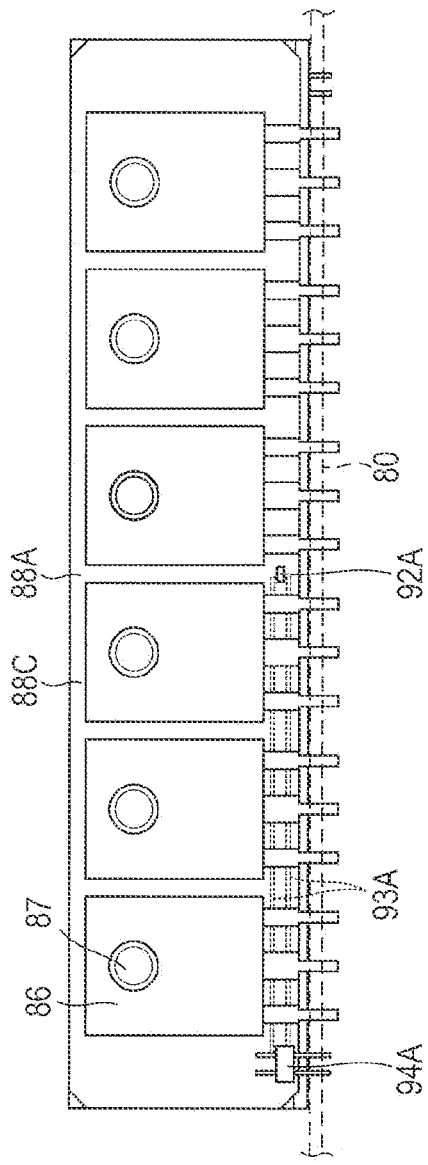
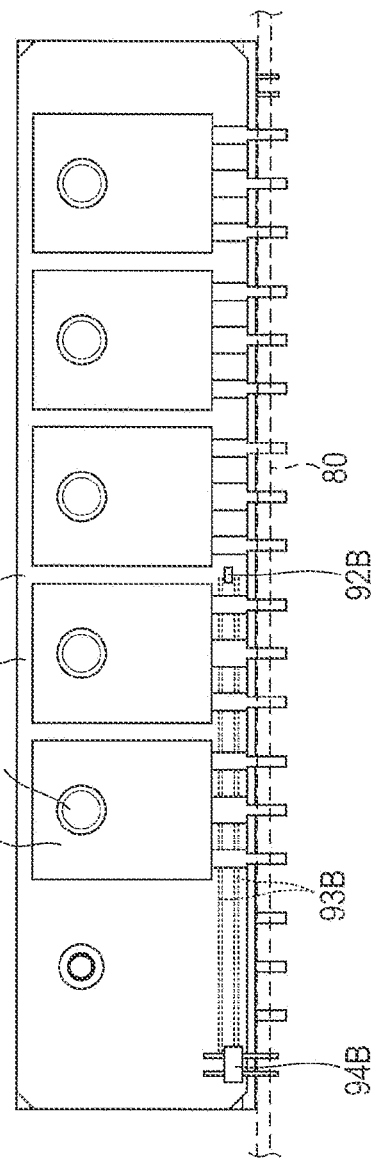
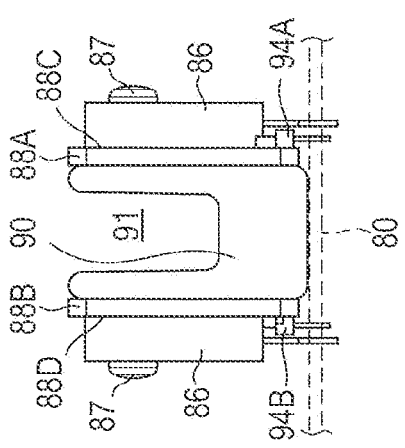

ELECTRIC WORKING MACHINE WITH SEMICONDUCTOR ELEMENT THAT COMPLETES OR INTERRUPTS CURRENT PATH TO MOTOR

CROSS-REFERENCE TO RELATED APPLICATIONS

This application claims the benefit of Japanese Patent Application No. 2018-222436 filed on Nov. 28, 2018 with the Japan Patent Office, the entire disclosures of which are incorporated herein by reference.

BACKGROUND

The present disclosure relates to an electric working machine with a semiconductor element that completes or interrupts a current path to a motor.

In an electric working machine, a semiconductor element that completes or interrupts a current path to a motor is mounted on a circuit board to which a control circuit is assembled. The control circuit turns on and off the semiconductor element to control energization to the motor.

Since the semiconductor element passes electric current for driving the motor, heat is easily generated. For this reason, the semiconductor element is attached to a heat sink for heat dissipation, and is adapted to dissipate heat efficiently via the heat sink (for example, see WO 2016/098564).

SUMMARY

Generally, a heat sink is made of a conductive metal such as aluminum. Therefore, when a semiconductor element is attached to the heat sink, an insulating sheet is interposed between the heat sink and the semiconductor element to insulate between the semiconductor element and the heat sink.

However, the insulating sheet is made of a low conductive material. Thus, the insulating sheet generally has poor thermal conductivity, and cannot efficiently transmit heat from the semiconductor element to the heat sink.

In one aspect of the present disclosure, it is desirable to provide an electric working machine in which thermal conductivity to a heat sink from a semiconductor element that completes or interrupts a current path to a motor is improved so that the semiconductor element can dissipate heat more efficiently.

The electric working machine in one aspect of the present disclosure includes: a motor; a semiconductor element that is provided in a current path to the motor and completes or interrupts the current path; and a circuit board on which the semiconductor element is mounted. A control circuit that turns on and off the semiconductor element to control energization to motor is assembled to the circuit board.

The semiconductor element is attached to a heat sink which is for dissipating heat from the semiconductor element via a metal-based board.

According to the electric working machine of the present disclosure, heat from the semiconductor element can be efficiently transmitted to the heat sink via the metal-based board having higher thermal conductivity than an insulating sheet. Heat dissipation characteristics of the semiconductor element by the heat sink can be improved. Therefore, it is possible to suppress temperature rise of the semiconductor element and damage to the semiconductor element due to heat.

The metal-based board may be provided with a temperature detection element. By coupling the temperature detection element to the control circuit assembled to the circuit board, the temperature of the semiconductor element provided on the metal-based board can be monitored on the control circuit side. When the semiconductor element enters an overheated state, the semiconductor element can be turned off. Thus, damage to the semiconductor element due to heat can be better suppressed.

The metal-based board may be provided with a wiring pattern for coupling the temperature detection element to the circuit board. This allows coupling the temperature detection element to the wiring pattern of the metal-based board, and coupling the temperature detection element to the circuit board via the wiring pattern. The temperature detection element can be easily coupled to the circuit board.

The wiring pattern and the circuit board may be coupled via a lead wire for coupling, or via a terminal provided on the metal-based board.

When two or more semiconductor elements are provided on the metal-based board, the temperature detection elements may be provided near each semiconductor element. However, since the metal-based board has high thermal conductivity, one temperature detection element may be provided for the metal-based board.

In this case, by arranging the temperature detection element among the semiconductor elements, the temperature of each semiconductor element can be more stably detected.

The semiconductor element may be coated with an insulating material on the metal-based board. This can protect the semiconductor element from water, iron powder, dust, etc. and suppress short circuit of a terminal of the semiconductor element coupled to the circuit board.

When the metal-based board is provided with the temperature detection element, the temperature detection element may be also coated with the insulating material. This allows the temperature detection element to detect the temperature of the metal-based board, and the semiconductor element, without being affected by outside air.

Also, when the heat sink is provided with a space for heat dissipation, the semiconductor element may be provided on opposite sides of the heat sink with the space interposed therebetween. This allows efficient dissipation of heat from the semiconductor element provided on opposite sides of the heat sink by outside air passing through the space of the heat sink.

BRIEF DESCRIPTION OF THE DRAWINGS

An example embodiment of the present disclosure will be described hereinafter with reference to the accompanying drawings, in which:

FIG. 5A is a front view of the heat sink seen from a direction of an arrow A in FIG. 4;

FIG. 5B is a back view of the heat sink seen from a direction of an arrow B in FIG. 4;

FIG. 5C is a side view of the heat sink seen from a direction of an arrow C in FIG. 4.

DETAILED DESCRIPTION OF EXEMPLARY EMBODIMENTS

The present embodiment illustrates a hand-held electric lawn mower as an electric working machine.

Figure 1:
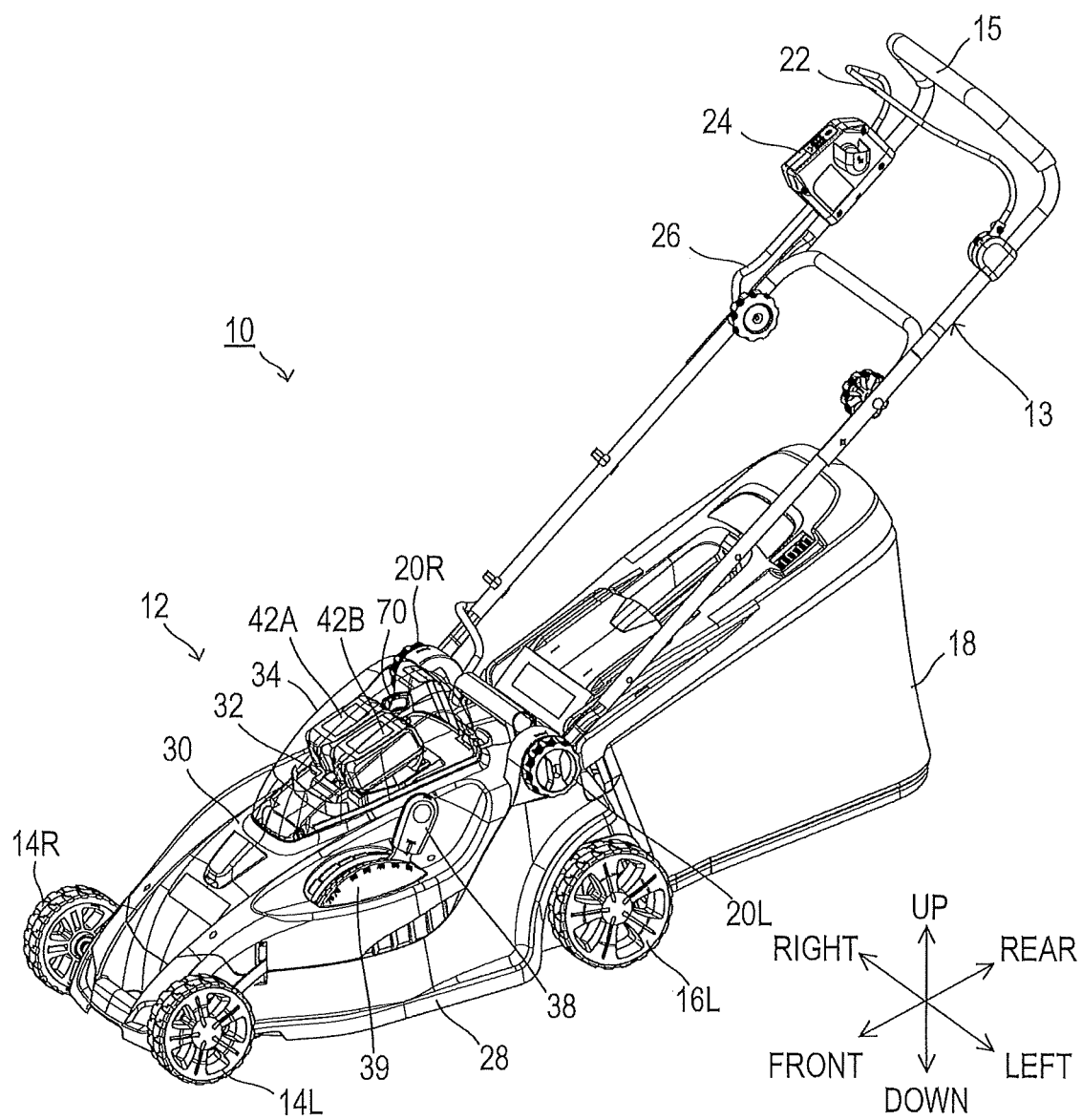
FIG. 1 is a perspective view showing a configuration of an entire electric working machine of an embodiment.

As shown in FIG. 1, an electric lawn mower 10 includes a main body 12 and a handle 13. The main body 12 is provided with front wheels 14L, 14R and rear wheels 16L, 16R (rear wheel 16R is not shown). On a rear side of the main body 12, a mowing box 18 to store mowed grass is detachably provided.

The handle 13 is provided to obliquely extend to an upper rear of main body 12 above the mowing box 18. The handle 13 is formed into a U-shape, and right and left ends thereof are fastened to the main body 12 via right and left fixing screws 20L, 20R, respectively. Therefore, the handle 13 can be stored on top of the main body 12 by loosening the fixing screws 20L, 20R and rotating the handle 13 onto the main body 12.

A holding portion 15 for a user to grip is provided in the center of, that is, on a rear side portion of, the handle 13. The user can grip the holding portion 15 of handle 13 on the rear side of the electric lawn mower 10 and push the main body 12 forward to perform mowing work.

A switch lever 22 is provided at the rear of the handle 13. The switch lever 22 is formed into a U-shape, and right and left ends thereof are supported on both sides of the handle 13 so that they can tilt within a specified range in an up-down direction.

A switch device 24 is provided on the right side of the handle 13, in a support portion at the right end of the switch lever 22. The user can tilt the switch lever 22 up and down with a fingertip of the hand gripping the holding portion 15 of the handle 13 to turn on and off an operation switch 25 (see FIG. 3) in the switch device 24.

In the present embodiment, the operation switch 25 is turned on when the switch lever 22 is tilted downward, and turned off when the switch lever 22 is tilted upward. The switch lever 22 is biased to an off position by a spring (not shown) at all time.

When the operation switch 25 is turned on, its signal is inputted to a controller 50 (see FIG. 3) of the main body 12 via a wiring 26, and a motor 40 (see FIG. 3) is driven by the controller 50.

Figure 2:
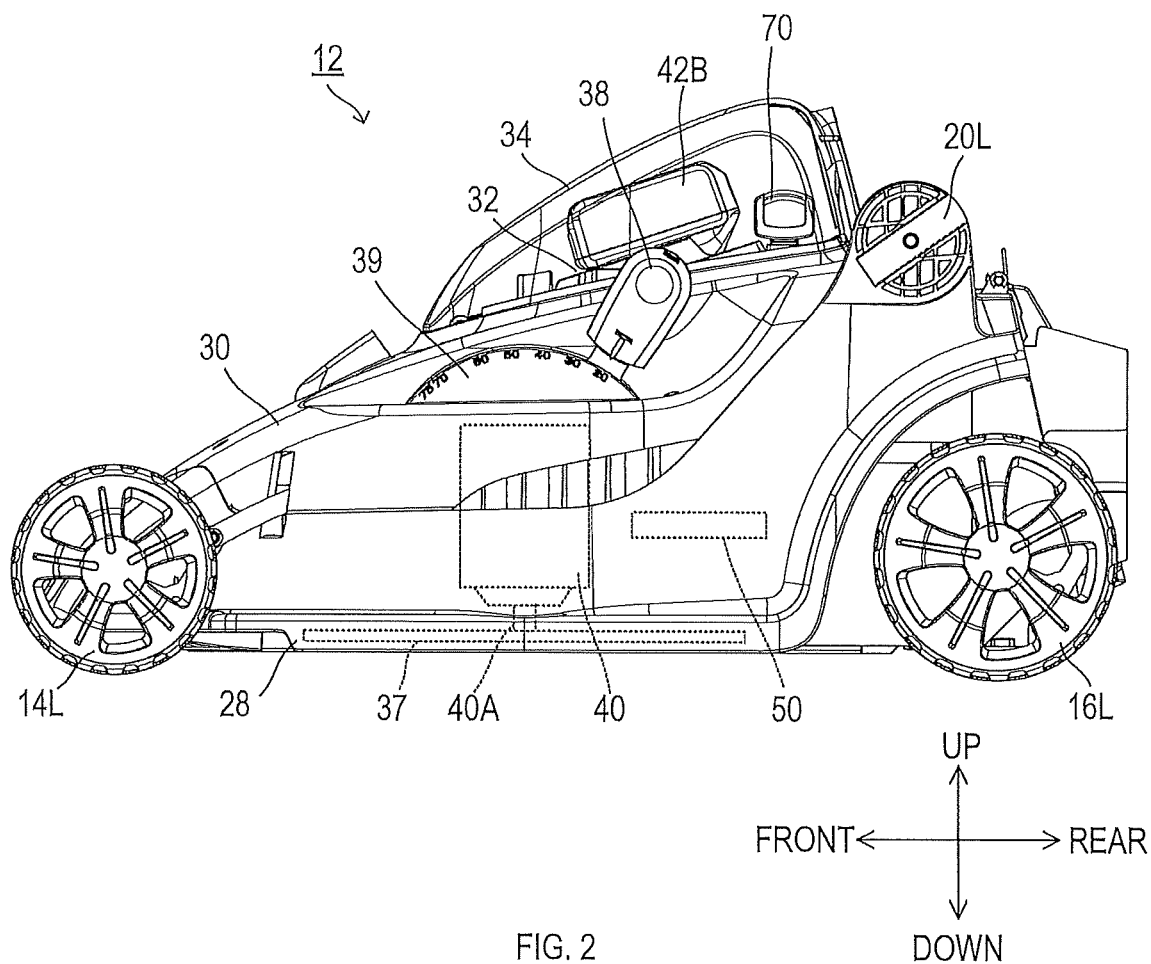
FIG. 2 is a side view of a main body of the electric working machine seen from a lateral direction.

As shown in FIG. 2, the main body 12 is provided with a deck 28 and a cowling 30. The deck 28 surrounds the top and periphery of a cutting blade 37 indicated by a dotted line in the figure, which is a so-called cutter housing. At four corners of the front, rear, right and left of the deck 28, front wheels 14L, 14R and rear wheels 16L, 16R are arranged. The cowling 30 is attached to the deck 28 to cover the top of the deck 28.

As indicated by a dotted line in the figure, the motor 40 is attached to a center top of the deck 28. The motor 40 is arranged in a downward posture with an output shaft 40A facing a road surface.

The motor 40 is arranged in a motor storage chamber that is a space between the deck 28 and the cowling 30. The motor storage chamber introduces outside air and discharges air that has cooled the motor 40. The motor 40 may be stored in a sealed motor housing.

The cutting blade 37 is attached to the output shaft 40A of the motor 40 in a manner to be parallel to the road surface. The cutting blade 37 rotates horizontally with the output shaft 40A so as to mow grass and the like.

A height of the cutting blade 37 from the road surface is a cutting height of the grass. The cutting height can be adjusted by a cutting height adjustment mechanism 39 provided on the left side of the main body 12.

The cutting height adjustment mechanism 39 is provided with a cutting height adjustment lever 38. When the user operates the cutting height adjustment lever 38 in a front-rear direction, the front wheels 14L, 14R and the rear wheels 16L, 16R are displaced in the up-down direction via a link mechanism (not shown). This operation adjusts a height of the deck 28, that is, the cutting height. Detailed description of the cutting height adjustment mechanism 39 will not be given.

A battery port 32 to which each of two batteries 42A, 42B (see FIG. 3) can be detachably attached is formed in the center of an upper surface of the cowling 30. A battery cover 34 that covers an upper surface opening of the battery port 32 is provided in the cowling 30. Therefore, the batteries 42A, 42B attached to the battery port 32 are stored in the battery cover 34 and protected.

The battery cover 34 is attached to the cowling 30 via a hinge so as to open and close the battery port 32. Therefore, the batteries 42A, 42B can be easily attached to and detached from the battery port 32 by opening the battery cover 34.

Figure 3:
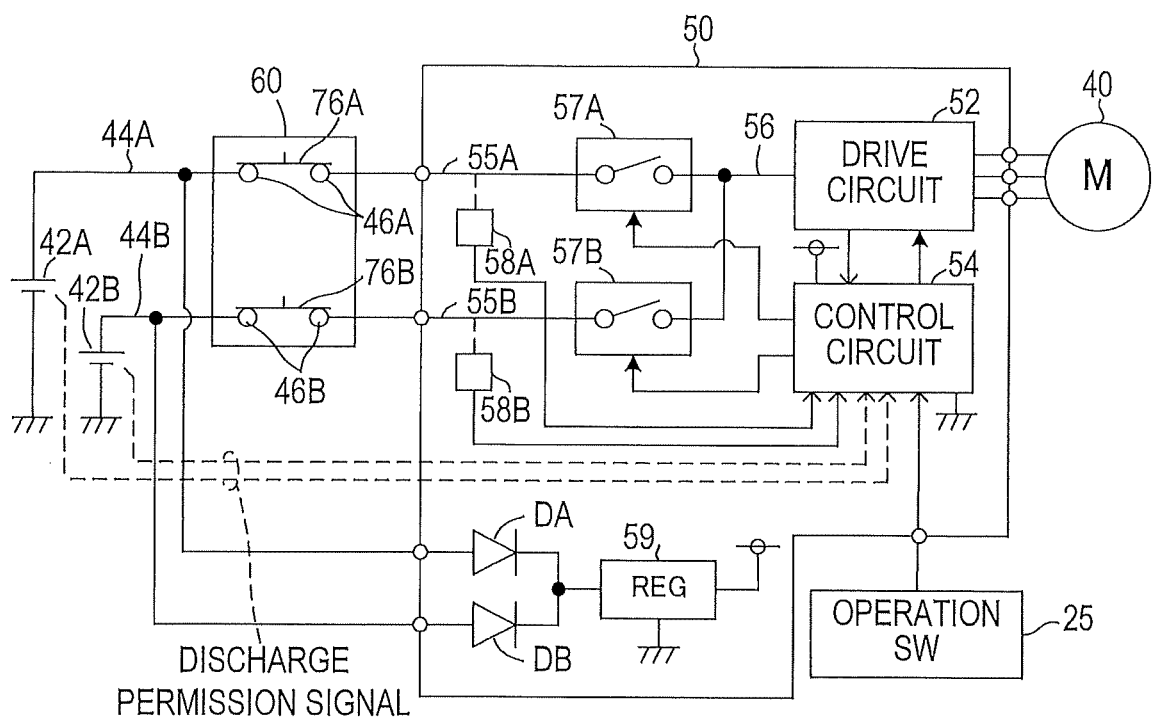
FIG. 3 is a block diagram showing a circuit configuration of an entire motor drive system of the electric working machine.

As shown in FIG. 3, positive sides of the batteries 42A, 42B attached to the battery port 32 are respectively coupled to the controller 50 via power-supply lines 44A, 44B as power supply paths. Also, negative sides of the batteries 42A, 42B are coupled to the ground of the controller 50 to have the same potential as the ground.

The controller 50 includes a drive circuit 52 and a control circuit 54. The drive circuit 52 drives the motor 40 by electric power supplied from the batteries 42A, 42B via the power-supply lines 44A, 44B. The control circuit 54 controls motor current supplied from the drive circuit 52 to the motor 40.

The motor 40 is configured by a three-phase brushless motor. The drive circuit 52 includes an inverter circuit that can control electric current flowing through each phase winding of the three-phase brushless motor.

The inverter circuit includes three high-side switches provided between a positive power-supply line 56 in the controller 50 and three terminals of the motor 40, and three low-side switches provided between the three terminals of the motor 40 and the ground.

The high-side switches and the low-side switches are switching elements each configured by a power MOSFET. In the present embodiment, a lead component with a lead for board mounting is used for the power MOSFET, in order to be attached to a later-described heat sink to facilitate heat dissipation.

When the operation switch 25 is on, the control circuit 54 controls electric current flowing to the motor 40 via the inverter circuit in the drive circuit 52, and rotates the motor 40 at a desired rotation speed.

The controller 50 includes a detection circuit that detects various states such as electric current supplied from the drive circuit 52 to the motor 40, temperature of the drive circuit 52 and so on, in addition to detection circuits 58A, 58B that detect battery voltages supplied via the power-supply lines 44A, 44B.

The control circuit 54 monitors a driving state of the motor 40 and a state of the controller 50 based on detection signals from these detection circuits. The control circuit 54 stops driving of the motor 40 when detecting malfunction such as overcurrent and overheating.

In the controller 50, power-supply lines 55A, 55B are provided that respectively couple the power-supply lines 44A, 44B from the batteries 42A, 42B and the power-supply line 56 in the controller 50. In other words, the batteries 42A, 42B are coupled in parallel to the power-supply line 56 coupled to the drive circuit 52 via the power-supply lines 44A and 55A, 44B and 55B.

Therefore, electric power is directly supplied to the drive circuit 52 from the batteries 42A, 42B attached to the battery port 32. Even when only one of the batteries 42A, 42B is attached to the battery port 32, the motor 40 can be driven.

The power-supply lines 55A, 55B are respectively provided with electronic switches 57A, 57B. The switches interrupt the corresponding power-supply lines 55A, 55B when the batteries 42A, 42B are not attached to the battery port 32, or when discharge permission signals are not outputted from the attached batteries 42A, 42B.

Each of the electronic switches 57A, 57B is configured by coupling two switching elements, each formed by a power MOSFET, in series. Similar to the switching elements in the drive circuit 52, lead components provided with leads for board mounting are used for the power MOSFETs constituting the electronic switches 57A, 57B, in order to be attached to the later-described heat sink to facilitate heat dissipation.

The batteries 42A, 42B are provided with monitoring circuits (not shown) that monitor whether the batteries 42A, 42B are dischargeable and output discharge permission signals when dischargeable. The control circuit 54 also receives the discharge permission signals.

The control circuit 54, when the discharge permission signal is outputted from the battery 42A and the electronic switch 57B is off, turns on the electronic switch 57A. Also, the control circuit 54, when the discharge permission signal is outputted from the battery 42B and the electronic switch 57A is off, turns on the electronic switch 57B.

In other words, the control circuit 54 selectively turns on one of the electronic switches 57A, 57B when the batteries 42A, 42B are attached to the battery port 32 and the both are dischargeable.

As a result, when the dischargeable batteries 42A, 42B are attached to the battery port 32, the power-supply line 55A or 55B can be conducted to supply electric power to the drive circuit 52.

In addition, the controller 50 is provided with a power-supply circuit (REG) 59 that receives power supply from the batteries 42A, 42B via power-supply lines 45A, 45B branched from the power-supply lines 44A, 44B and via backflow suppression diodes DA, DB and generates a power-supply voltage. The control circuit 54 receives the power-supply voltage generated in the power-supply circuit (REG) 59 to operate.

In the electric lawn mower 10 of the present embodiment configured as above, when at least one of the batteries 42A, 42B is attached to the battery port 32, the control circuit 54 becomes operable. When the operation switch 25 is turned on in this state, the motor 40 is driven.

Therefore, even if the operation switch 25 is turned on against the user's intent when at least one of the batteries 42A, 42B is attached to the battery port 32, electric current flows to the motor 40 and the cutting blade 37 rotates.

Thus, in the electric lawn mower 10 of the present embodiment, the power-supply lines 44A, 44B extending from the batteries 42A, 42B attached to the battery port 32 are cut on their way to the controller 50, and insertion of a key 70 (see FIGS. 1 and 2) to the cuts allows the power-supply lines 44A, 44B to be conducted through the cuts.

In the power-supply lines 44A, 44B, the cuts are closer to the controller 50 than branch points to the power-supply lines 45A, 45B. Therefore, electric power is directly supplied to the power-supply circuit (REG) 59 in the controller 50 from the batteries 42A, 42B attached to the battery port 32 via the power-supply lines 45A, 45B.

As shown in FIGS. 1 and 2, in the electric lawn mower 10 of the present embodiment, an attachment point of the key 70 is a rear end on the right side of the battery port 32 covered with the battery cover 34 on the upper surface of the cowling 30. Thus, the key 70 can be attached to and detached from the electric lawn mower 10 by opening the battery cover 34.

Also, as shown in FIG. 3, a terminal portion 60 for attaching the key 70 is provided in the cuts of the power-supply lines 44A, 44B. The terminal portion 60 is fixed to the attachment point of the key 70, that is, a right rear end of the battery port 32. Contact points 46A, 46B respectively coupled to opposite ends of the cuts of the power-supply lines 44A, 44B are stored in the terminal portion 60.

The key 70 is provided with coupling pieces 76A, 7613 that are attached to the terminal portion 60 to couple the contact points 46A-46A, 46B-46B on the opposite ends of the cuts of the power-supply lines 44A, 44B and allows the power-supply lines 44A, 44B to be conducted through the cuts.

Thus, when the electric lawn mower 10 is not in use, the user can remove the key 70 from the terminal portion 60 to physically interrupt the power supply paths from the batteries 42A, 42B to the drive circuit 52 in the controller 50, and further to the motor 40. In this state, electric current does not flow to the motor 40 so that rotation of the motor 40 can be suppressed.

Configuration of the controller 50 will be described with reference to FIGS. 4 to 6.

Figure 4:
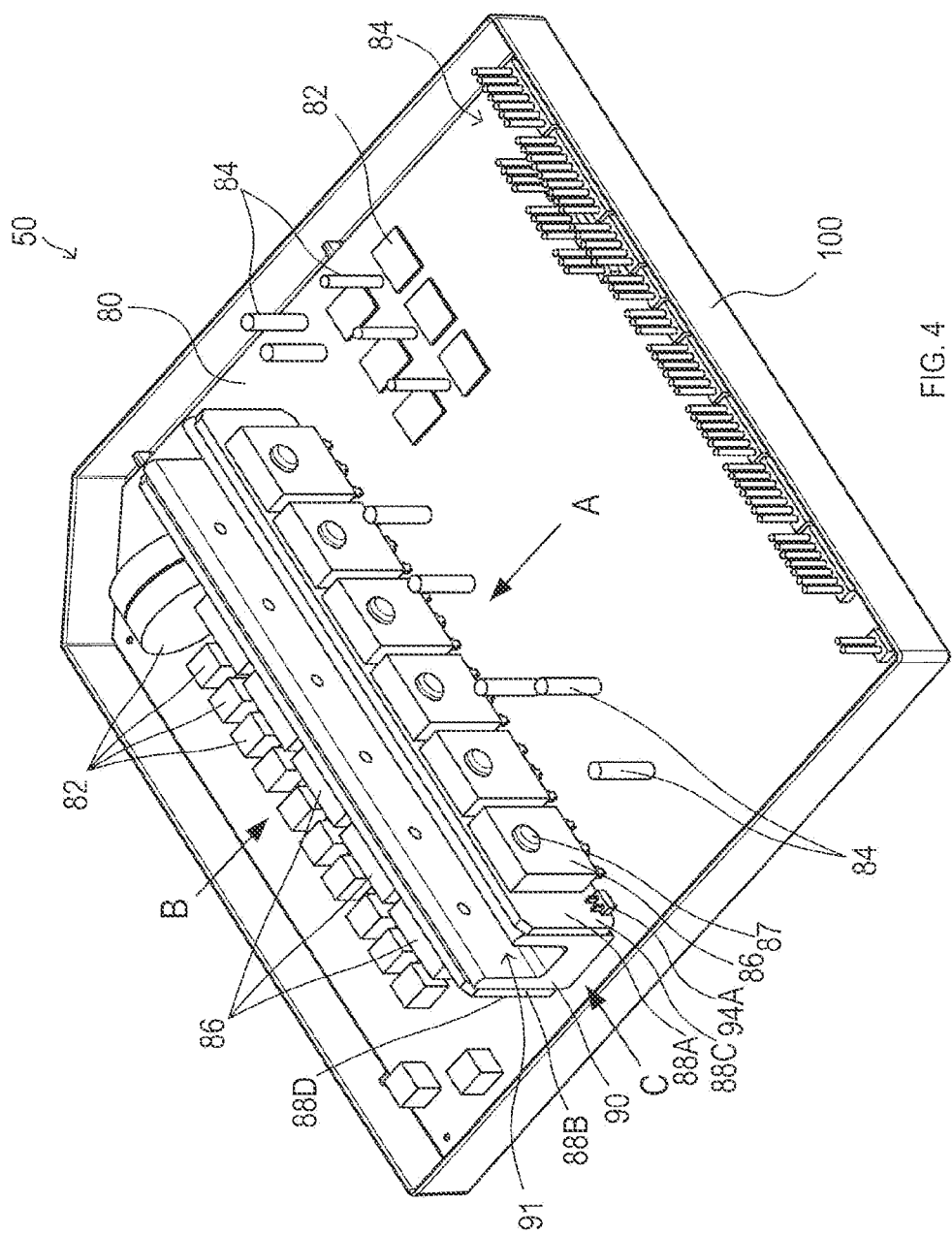
FIG. 4 is a perspective view showing a circuit board and a heat sink of the motor drive system, and the surrounding electronic components.

As shown in FIG. 4, the controller 50 is configured by mounting various electronic components 82 such as the drive circuit 52, the control circuit 54, the detection circuits 58A, 58B, the electronic switches 57A, 57B, the power-supply circuit 59, and the like, and various terminals 84 on a circuit board 80.

The circuit board 80 is a printed circuit board with a wiring pattern for circuit configuration. Among the various electronic components 82 mounted on the circuit board 80, a semiconductor element 86 through which a feeding current flows to the motor 40 and which easily generates heat is attached to a heat sink 90 with a screw 87.

The semiconductor element 86 attached to the heat sink 90 includes six switching elements that configure the inverter circuit, four switching elements that configure the electronic switches 57A, 57B, and one switching element for surge voltage absorption. In other words, eleven power MOSFETs with leads are attached to the heat sink 90, as the semiconductor elements 86.

In each of the eleven semiconductor elements 86, the periphery of a screw hole through which the screw 87 is inserted is molded with an insulating resin. In this case, a metal screw is used as the screw 87 since there is no need to consider insulation between the screw 87 and the semiconductor element 86.

Depending on the type of the semiconductor element 86, however, a screw part may be made from the same metal as a terminal part on the back of the semiconductor element 86. In such cases, a non-conductive resin screw or a metal screw insulated with resin bush is used as the screw 87, so that the semiconductor element 86 is not electrically coupled to the heat sink 90.

As shown in FIG. 5, by fixing the heat sink 90 to the circuit board 80, the lead is inserted to a hole drilled in the circuit board 80 and soldered to a land provided around the hole. As a result, each of the semiconductor elements 86 is mounted on the circuit board 80.

The heat sink 90 is, for example, made from aluminum and has a longitudinal shape so that the semiconductor elements 86 can be arranged along a board surface of the circuit board 80. Six semiconductor elements 86 are attached to one surface (hereinafter, front surface) in a longitudinal direction of the heat sink 90, and five semiconductor elements 86 are attached to the other surface (hereinafter, back surface).

The heat sink 90 includes a space 91 for introducing outside air between the front surface and the back surface to which the semiconductor elements 86 are attached. A side opposite to an attachment surface to the circuit board 80 of the space 91 is opened. As shown in FIG. 5C, the heat sink 90 has a U-shape when seen from a lateral direction which is different from attachment surfaces of the semiconductor elements 86. Since the outside air enters inside the U-shape, heat is easily dissipated.

The heat sink 90 is provided with metal-based boards 88A, 88B respectively on the front surface and the back surface to which the semiconductor elements 86 are attached. The semiconductor elements 86 are fixed on insulating layers 88C, 88D or insulating coatings of the metal-based boards 88A, 88B.

Between the metal-based boards 88A, 88B and the heat sink 90, and between the metal-based boards 88A, 88B and the semiconductor elements 86, silicone grease is applied to efficiently transfer heat.

The metal-based boards 88A, 88B may each be formed by stacking the insulating layers 88C, 88D, respectively, on a board surface of a metal board made from aluminum or copper, for example, and stacking a conductive layer made of copper or the like for forming a wiring pattern thereon. In the present embodiment, the same aluminum board as that of the heat sink 90 is used as base material of the metal-based boards 88A, 88B.

As above, in the present embodiment, the semiconductor elements 86 which are power MOSFETs, are attached to the heat sink 90 via the metal-based boards 88A, 88B.

Therefore, as compared to a case of providing insulating sheets between the semiconductor elements 86 and the heat sink 90, heat of the semiconductor elements 86 can be efficiently transferred to the heat sink 90, and heat dissipation effect of the semiconductor elements 86 by the heat sink 90 can be enhanced.

Also, since the heat sink 90 includes the space 91 for heat dissipation, it is possible to increase heat dissipation area of the heat sink 90 to more efficiently dissipate heat from the semiconductor elements 86 provided on the front surface and the back surface of the heat sink 90.

Also, for example, when a blower fan is used to flow cooling air to the space 91 of the heat sink 90, heat is better dissipated.

According to the present embodiment, overheating of the semiconductor elements 86, which are so-called power transistors, attached to the heat sink 90 can be suppressed, and damage of the semiconductor elements 86 by heat can be suppressed.

In the metal-based boards 88A, 88B, wiring patterns can be formed on the board surfaces on which the semiconductor elements 86 are provided. The metal-based boards 88A, 88B are provided with temperature sensors 92A, 92B to detect temperatures of the semiconductor elements 86.

The temperature sensors 92A, 92B are configured by chip parts on which the wiring patterns can be directly soldered, and are provided between two semiconductor elements 86, at the center in a longitudinal direction of the metal-based boards 88A, 88B.

Therefore, wiring patterns 93A, 93B coupled to the temperature sensors 92A, 92B to take out detection signals from the temperature sensors 92A, 92B are formed on the metal-based boards 88A, 88B.

The wiring patterns 93A, 93B are provided from centers of the metal-based boards 88A, 88B where the temperature sensors 92A, 92B are provided to one end sides (left end side in the figure) in the longitudinal direction of the metal-based boards 88A, 88B.

On opposite ends of the wiring patterns 93A, 93B to the temperature sensors 92A, 92B, pin headers 94A, 94B with terminals (pins) are provided to couple the wiring patterns 93A, 93B to the wiring pattern on the circuit board 80.

As a result, the temperature sensors 92A, 92B mounted on the metal-based boards 88A, 88B are coupled to the wiring pattern on the circuit board 80, and are coupled to the control circuit 54 on the circuit board 80 via the wiring pattern.

Therefore, the control circuit 54 can monitor temperatures of the semiconductor elements 86 provided on the metal-based boards 88A, 88B and interrupt the current path to the motor 40 when the temperature of any of the semiconductor elements 86 reaches a specified maximum temperature, thereby suppressing damage to the semiconductor elements 86.

One temperature sensor 92A and one temperature sensor 92B are respectively provided between the two semiconductor elements 86 at the center in the longitudinal direction of the metal-based board 88A and the metal-based board 88B. This is because the metal-based boards 88A, 88B are aluminum boards and have excellent thermal conductivity.

In other words, in the present embodiment, one temperature sensor 92A and one temperature sensor 92B are respectively provided at the center of the metal-based board 88A and the metal-based board 88B, so that overheating of at least one of the semiconductor elements 86 can be detected.

Thus, when it is necessary to accurately and individually detect the temperatures of the semiconductor elements 86, a temperature sensor may be provided in vicinity of each of the semiconductor elements 86.

As shown in FIG. 4, the circuit board 80 to which the heat sink 90 is attached as described above is stored in a flat resin case 100 that has an opening to store the circuit board 80. The circuit board 80 is stored such that the heat sink 90 is on the opening side of the case 100.

Figure 6:
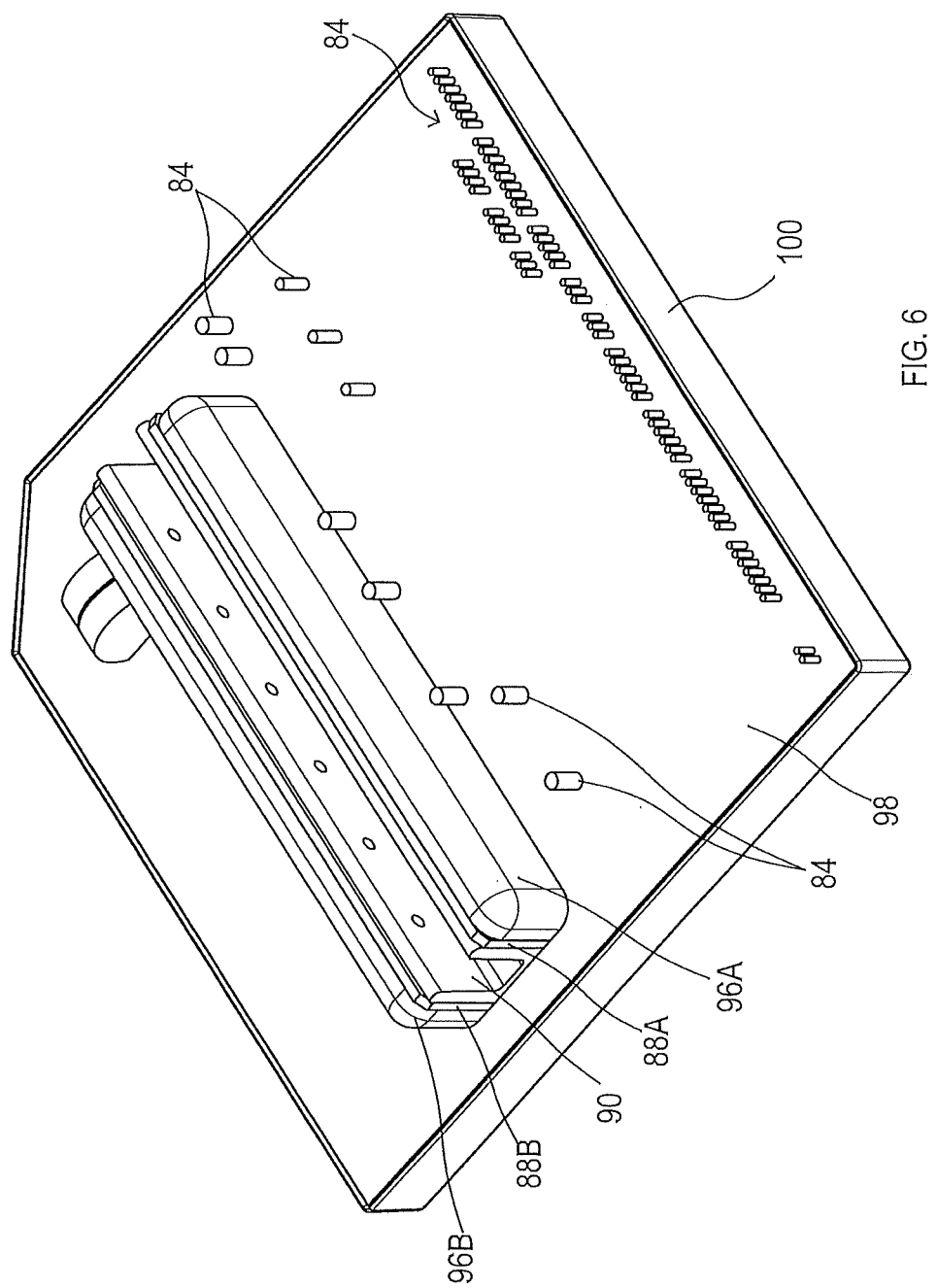
FIG. 6 is a perspective view showing the circuit board and the electronic components in FIG. 4 coated with an insulating material.

When the circuit board 80 is stored in the case 100, as shown in FIG. 6, the entire attachment surfaces of the semiconductor elements 86 on the metal-based boards 88A, 88B are coated with insulating materials 96A, 96B made from adhesive and mold material.

After the circuit board 80 is stored in the case 100, for example, by pouring resin from an upper surface side of the circuit board 80 to which the heat sink 90 is attached, the periphery of the circuit board 80 is also coated with insulating material 98.

As a result, the entire controller 50 including the semiconductor elements 86 and the temperature sensors 92A, 92B attached to the heat sink 90 is covered with the insulating materials and protected from water, iron powder, dust, and so on.

The embodiment of the present disclosure has been described in the above. The present disclosure is not limited to the above-described embodiment and various modifications can be made.

For example, in the aforementioned embodiment, the semiconductor elements 86 are provided on both the front surface and the back surface of the heat sink 90 with the metal-based board 88A, 88B interposed therebetween.

However, when the heat sink 90 has the same potential as that of the positive power-supply line 56, a semiconductor element of which drain is coupled to the power-supply line 56 such as a semiconductor element used as a high-side switch of an inverter circuit, etc. can be directly attached to the heat sink 90.

This is because a FET with a lead that forms the semiconductor element 86 generally has a drain on an attachment surface to a heat sink and the like.

Therefore, the semiconductor elements of which drains may be coupled to the power-supply line 56 are directly attached to one side of the heat sink 90, and the remaining semiconductor elements may be attached to the other side of the heat sink 90 with metal-based boards interposed therebetween.

In the aforementioned embodiment, the heat sink 90 includes the space 91 that separates the front surface side and the back surface side. However, it is not always necessary to provide the space 91. Also, to increase heat dissipation performance of the heat sink 90, a fin for heat dissipation may be provided inside the space 91 or on the upper surface of the heat sink 90.

In the aforementioned embodiment, the semiconductor elements 86 are provided on both the front surface and the back surface of heat sink 90. The semiconductor elements 86 may be arranged in one row on one side of the heat sink 90.

In the aforementioned embodiment, an example of the electric working machine of the present disclosure is an electric lawn mower. However, the electric working machine of the present disclosure is not limited to an electric lawn mower. For example, an electric working machine such as an electric power tool in which a semiconductor element provided in a current path to a motor is attached to a heat sink can have the same effect by applying the present disclosure in the same manner as in the aforementioned embodiment.

Functions of one component in any of the aforementioned embodiments may be implemented by two or more components, and a function of one component may be implemented by two or more components. Functions of two or more components may be implemented by one component, and a function implemented by two or more components may be implemented by one component. A part of the configuration of any of the aforementioned embodiments may be omitted. At least a part of the configuration of one of the aforementioned embodiment may be added to or replaced with the configuration of the other of the embodiments.

What is claimed is:

1. An electric working machine comprising:
   a motor;
   a battery;
   a drive circuit for driving the motor, the drive circuit including an inverter circuit that controls electric current flowing through a phase winding of the motor;
   a first semiconductor switch provided in a power-supply line from the battery to the drive circuit;
   a control circuit that controls electric current supplied from the battery to the motor via the drive circuit;
   a second semiconductor switch of the inverter circuit coupled to a terminal of the motor;
   a heat sink made of a conductive metal and to which the first semiconductor switch and the second semiconductor switch are attached; and
   a metal-based board that is a printed circuit board and is disposed between the first semiconductor switch and the heat sink, and between the second semiconductor switch and the heat sink, the metal-based board having:
   a board surface; and
   an insulating layer stacked on the board surface,
   a wiring pattern provided on the insulating layer,
   wherein the first semiconductor switch and the second semiconductor switch are fixed on the insulating layer to be attached to the heat sink via the metal-based board.

2. The electric working machine according to claim 1, further comprising:
   a non-conductive screw that attaches the semiconductor element to the heat sink.

3. The electric working machine according to claim 1, further comprising:
   a screw that attaches the semiconductor element to the heat sink; and
   a screw hole in the semiconductor element in which the screw is disposed, the screw hole being molded with an insulating resin.

4. An electric working machine comprising:
   a motor;
   a semiconductor element that is provided in a current path to the motor and completes or interrupts the current path;
   a circuit board on which the semiconductor element is mounted, a control circuit that turns on and off the semiconductor element to control energization to the motor being disposed on the circuit board;
   a heat sink made of a conductive metal for dissipating heat from the semiconductor element; and
   a metal-based board that is a printed circuit board, the metal-based board having:
   a board surface; and
   an insulating layer stacked on the board surface,
   a wiring pattern provided on the insulating layer,
   wherein the semiconductor element is fixed on the insulating layer and attached to the heat sink via the metal-based board.

5. The electric working machine according to claim 4, further comprising:
   a temperature detection element of the metal-based board, the temperature detection element being coupled to the control circuit.

6. The electric working machine according to claim 5, wherein the wiring pattern being for coupling the temperature detection element to the circuit board.

7. The electric working machine according to claim 5, wherein
   the metal-based board is provided with two or more of the semiconductor elements, and the temperature detection element is arranged among the semiconductor elements.

8. The electric working machine according to claim 4, wherein the semiconductor element is coated with an insulating material on the metal-based board.

9. The electric working machine according to claim 4, further comprising:

a space in the heat sink for heat dissipation, wherein the semiconductor element is provided on opposite sides of the heat sink with the space interposed therebetween.

10. The electric working machine according to claim 9, further comprising:

a substantially U-shaped section of the heat sink in which the space is disposed.

* * * * *